(12) United States Patent
Briones et al.

(10) Patent No.: US 6,806,742 B1
(45) Date of Patent: Oct. 19, 2004

(54) PHASE DETECTOR FOR LOW POWER APPLICATIONS

(75) Inventors: Luis J. Briones, Chandler, AZ (US); Klaas Wortel, Phoenix, AZ (US)

(73) Assignee: Standard Microsystems Corporation, Hauppauge, NY (US)

(*) Notice: Subject to any disclaimer, the term of this patent is extended or adjusted under 35 U.S.C. 154(b) by 0 days.

(21) Appl. No.: 10/444,670

(22) Filed: May 23, 2003

(51) Int. Cl.[7] .............................................. G01R 25/00
(52) U.S. Cl. ............................ 327/10; 327/9; 331/25
(58) Field of Search .......................... 327/2–5, 7–10, 327/12, 156–159; 331/25, 1 A; 375/376

(56) References Cited

U.S. PATENT DOCUMENTS

| | | | | |
|---|---|---|---|---|
| 4,349,756 A | | 9/1982 | Newton | 327/3 |
| 4,358,736 A | * | 11/1982 | De Boer | 327/3 |
| 4,634,998 A | * | 1/1987 | Crawford | 331/1 A |
| 5,208,546 A | * | 5/1993 | Nagaraj et al. | 327/157 |
| 5,331,230 A | * | 7/1994 | Ichihara | 327/9 |
| 5,410,195 A | * | 4/1995 | Ichihara | 327/10 |
| 6,002,273 A | | 12/1999 | Humphreys | 327/3 |
| 6,480,070 B2 | | 11/2002 | Locher | 331/17 |
| 2002/0136342 A1 | * | 9/2002 | Lee et al. | 375/376 |

OTHER PUBLICATIONS

Semiconductor Components Industries, LLC, "3.3 V ECL Phase–Frequency Detector," Publication Mc100EP140/D, Sep. 2002, 8 pages.

Agere Systems, Inc., "LUCDA4044 Phase Frequency Detector," Preliminary Data Sheet, Aug. 1998, 5 pages.

* cited by examiner

*Primary Examiner*—Minh Nguyen
(74) *Attorney, Agent, or Firm*—Meyertons Hood Kivlin Kowert & Goetzel, P.C.; Jeffrey C. Hood

(57) ABSTRACT

A low-power phase detector with differential output may comprise a control signal generator. In one embodiment, two cyclic waveforms whose phase relationship is to be measured may be input to a control signal generator. The control signal generator may output a first control signal corresponding to the first cyclic waveform such that the control signal is de-asserted at a specific point with respect to the first cyclic waveform. For example, the control signal may be de-asserted corresponding to the rising edge of the first cyclic waveform. The control signal generator may also output a second control signal corresponding to the second cyclic waveform such that the control signal is asserted at a specific point with respect to the second cyclic waveform. For example, the control signal may be asserted corresponding to the falling edge of the second cyclic waveform.

20 Claims, 6 Drawing Sheets

PHASE DETECTOR FOR LOW POWER APPLICATIONS

BACKGROUND OF THE INVENTION

1. Field of the Invention

This invention relates to integrated circuits, and more particularly, to phase detectors implemented as integrated circuits.

2. Description of the Related Art

The basic operation of a Phase/Frequency Detector (PFD) is to compare an received signal to a reference signal and generate an output that is indicative of the difference in phase between the two input signals. A common application for a PFD is in Phase-Locked Loop (PLL) circuits. PLLs are commonly used in clock-recovery circuits for data receivers/decoders.

A typical PFD provides two output pulse streams referred to as UP and DOWN. When the feedback signal (FB) lags the reference signal (REF), the duty cycle of the UP pulse stream will be proportional to the phase difference between REF and FB, while the duty cycle of the DOWN pulse stream will be minimal. Conversely, when FB leads REF, the duty cycle of the UP pulse stream will be minimal and the duty cycle of the DOWN pulse stream will be proportional to the phase difference between FB and REF. When the UP and DOWN pulse streams are integrated and subtracted, the result is an output signal whose amplitude is proportional to the phase difference between the two input signals.

In a typical PLL, the UP and DOWN pulse streams are applied to low-pass filter RC networks containing significant capacitance to ground in order to achieve the integration function. Subsequently the two integrated signals are applied to a differential amplifier whose output amplitude corresponds to the phase difference between FB and REF. This error signal is then input to a Voltage-Controlled Oscillator (VCO) to control the frequency of its output signal. The output frequency of the VCO is proportional to the amplitude of the input signal.

The output of the VCO is typically a signal whose frequency is some multiple of the frequency of the reference signal, and therefore a frequency divider is included after the VCO to produce the FB signal at the proper frequency. When the PLL is "locked", the output of the low-pass filter stage (input to the VCO) should be a constant voltage.

SUMMARY

Various embodiments of a method and apparatus for detecting a phase relationship between input periodic waveforms are disclosed. In one embodiment, two cyclic waveforms whose phase relationship is to be measured may be input to a control signal generator. The control signal generator may output a first control signal corresponding to the first cyclic waveform such that the control signal is de-asserted at a specific point with respect to the first cyclic waveform. For example, the control signal may be de-asserted corresponding to the rising edge of the first cyclic waveform.

The control signal generator may also output a second control signal corresponding to the second cyclic waveform such that the control signal is asserted at a specific point with respect to the second cyclic waveform. For example, the control signal may be asserted corresponding to the falling edge of the second cyclic waveform.

The first and second control signals may be applied to and control the function of a switch. The switch may be coupled between the output of a current source and a capacitor so as to control the charging of the capacitor by current from the current source.

The de-assertion of the first control signal may close the switch and allow current from the current source to charge the capacitor. The value of current flowing into the capacitor may be constant and therefore, the charge on the capacitor may increase linearly with time while the switch is closed. The assertion of the second control signal may open the switch cutting off the flow of current to the capacitor. With the capacitor isolated from the current source, the charge on the capacitor and therefore the voltage across the capacitor may remain constant with respect to time. The constant value of the voltage across the capacitor after the opening of the switch may represent a phase relationship between the first and second input cyclic waveforms.

In some embodiments, the phase detector may be implemented as part of an integrated circuit using, for example, CMOS technology. In such embodiments, one terminal of the capacitor may be coupled through one pole of a switch to a current source, while the other terminal of the capacitor is coupled through a second pole of the switch to a current sink. When the switch is open, the capacitor may be isolated from both voltage rails and the voltage across the capacitor may be output as a differential signal.

A discharge switch may be coupled between the first and second terminals of the capacitor. When the discharge switch is closed in response to the assertion of the first control signal, the charge on the capacitor may rapidly dissipate through the switch. The capacitor may be discharged in preparation for making a subsequent measurement of the phase relationship between the input cyclic waveforms.

An output switch including two poles may be coupled between the terminals of the capacitor and the output terminals of the phase detector. The output switch may be controlled by the first and second control signals such that the assertion of the second control signal causes the output switch to close, thereby outputting the constant, isolated voltage across the capacitor. The output switch may open in response to the assertion of the first control signal prior to the discharge of the capacitor at the end of the current phase measurement cycle.

The phase detector may be used to implement a phase-locked loop in order to generate an output signal whose frequency is some multiple of the frequency of first cyclic waveform and whose phase has a constant relationship with the fist cyclic waveform. In such implementations, the output of the phase detector may be used to control a VCO such that the second cyclic waveform, which may be a derivative of the VCO's output, is synchronized with the first cyclic waveform.

BRIEF DESCRIPTION OF THE DRAWINGS

Other aspects of the invention will become apparent upon reading the following detailed description and upon reference to the accompanying drawings in which.

Figure 1:
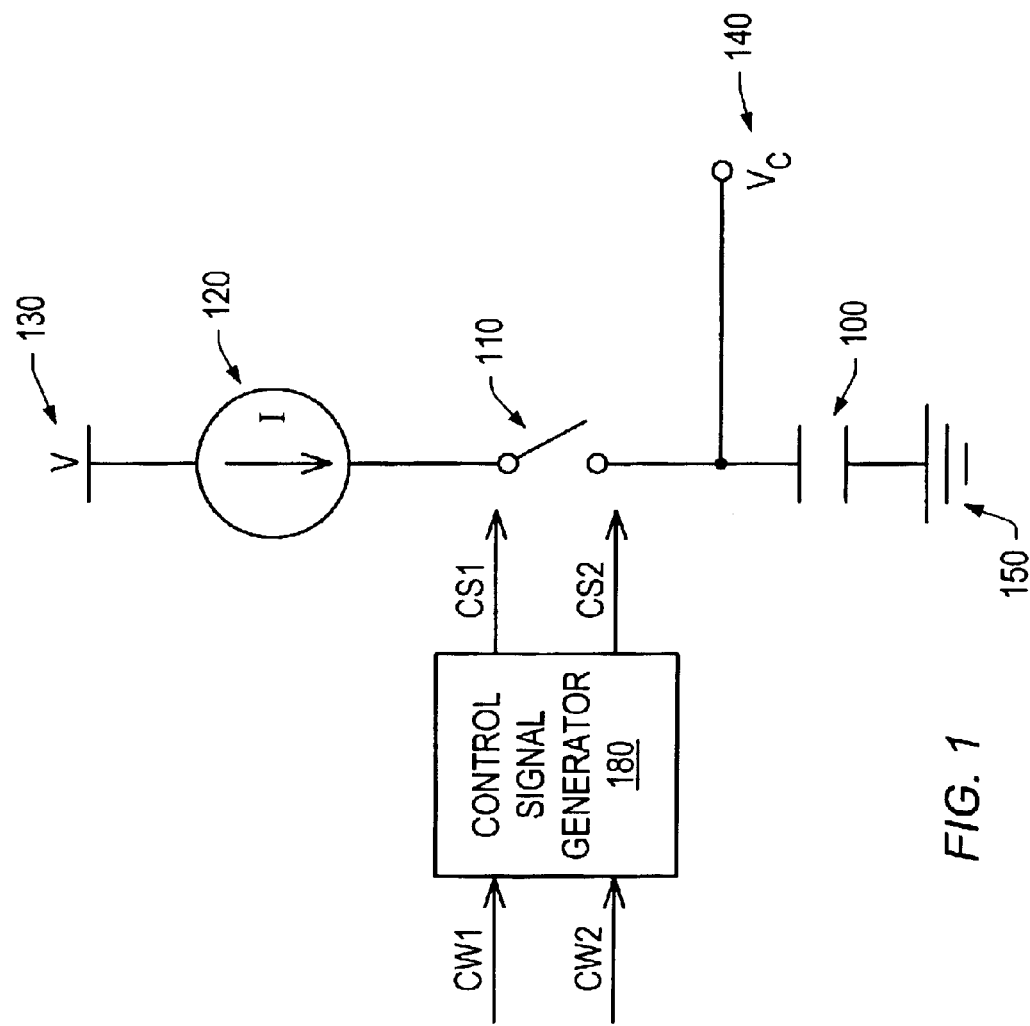
FIG. 1 shows a diagram of a phase detector, according to one embodiment.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF EMBODIMENTS

Phase Detector

FIG. 1 shows a diagram of a phase detector, according to one embodiment. The input to the phase detector may include cyclic waveforms CW1 and CW2 whose phase relationship is to be determined. CW1 and CW2 may be input into control signal generator 180. The control signal generator may generate control signals CS1 and CS2 dependent upon cyclic waveforms CW1 and CW2. In some embodiments, the control signal generator may de-assert CS1 at a specific point with respect to the first cyclic waveform CW1. For example, in embodiments in which CW1 may be a square wave, the control signal generator may de-assert CS1 coincident with the rising or falling edge of CW1. Likewise, the assertion of CS2 may correspond to the rising or falling edge of CW2.

Figure 2:
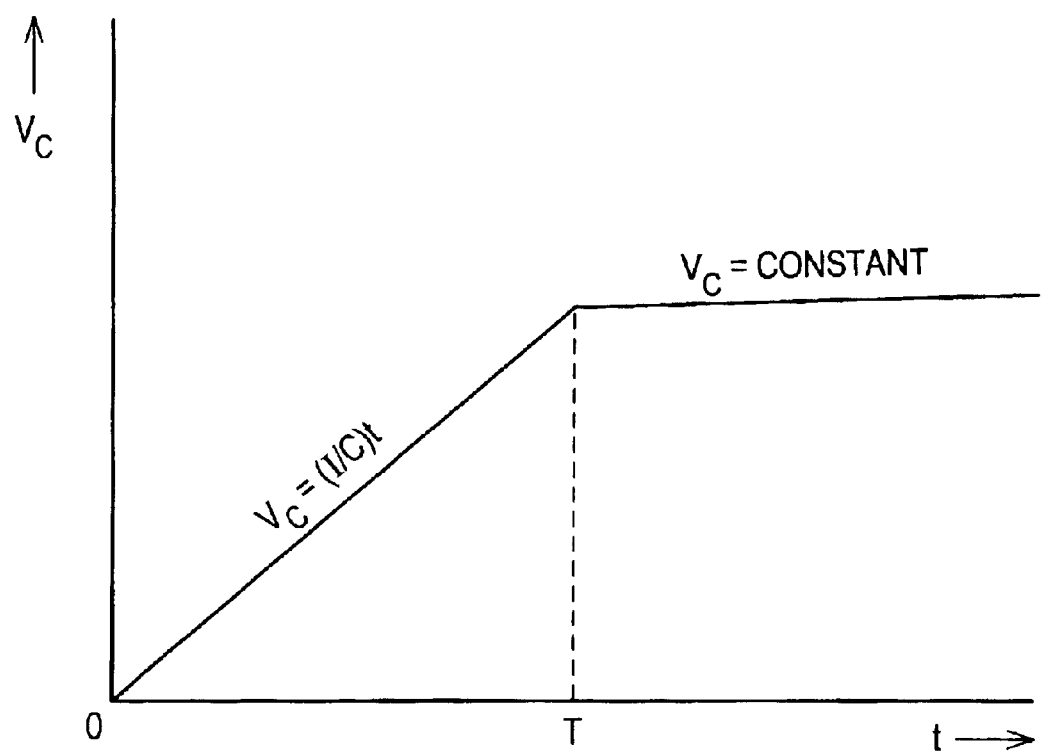
FIG. 2 is graphical representation of the voltage across the capacitor of the phase detector, according to one embodiment.

Current source 120 derives power from voltage rail V 130 and may supply a constant current I to capacitor 100 when switch 110 is closed. Control signals CS1 160 and CS2 170 may determine the state of switch 110. Switch 110 may close in response to CS1 transitioning from the asserted state to the de-asserted state. Constant current I may flow into capacitor 100 and the voltage across the capacitor Vc may increase linearly with time as shown by the inclined portion of the curve in FIG. 2. At time T, switch 110 may open in response to CS2 transitioning from the de-asserted state to the asserted state. When switch 110 is open, there may be no current flow into or out of capacitor 100 and therefore, Vc may assume a constant value with respect to time as shown by the horizontal portion of the curve in FIG. 2. The constant value of Vc may correspond to a phase and/or frequency relationship between the first and second cyclic waveforms CW1 and CW2.

Figure 3:
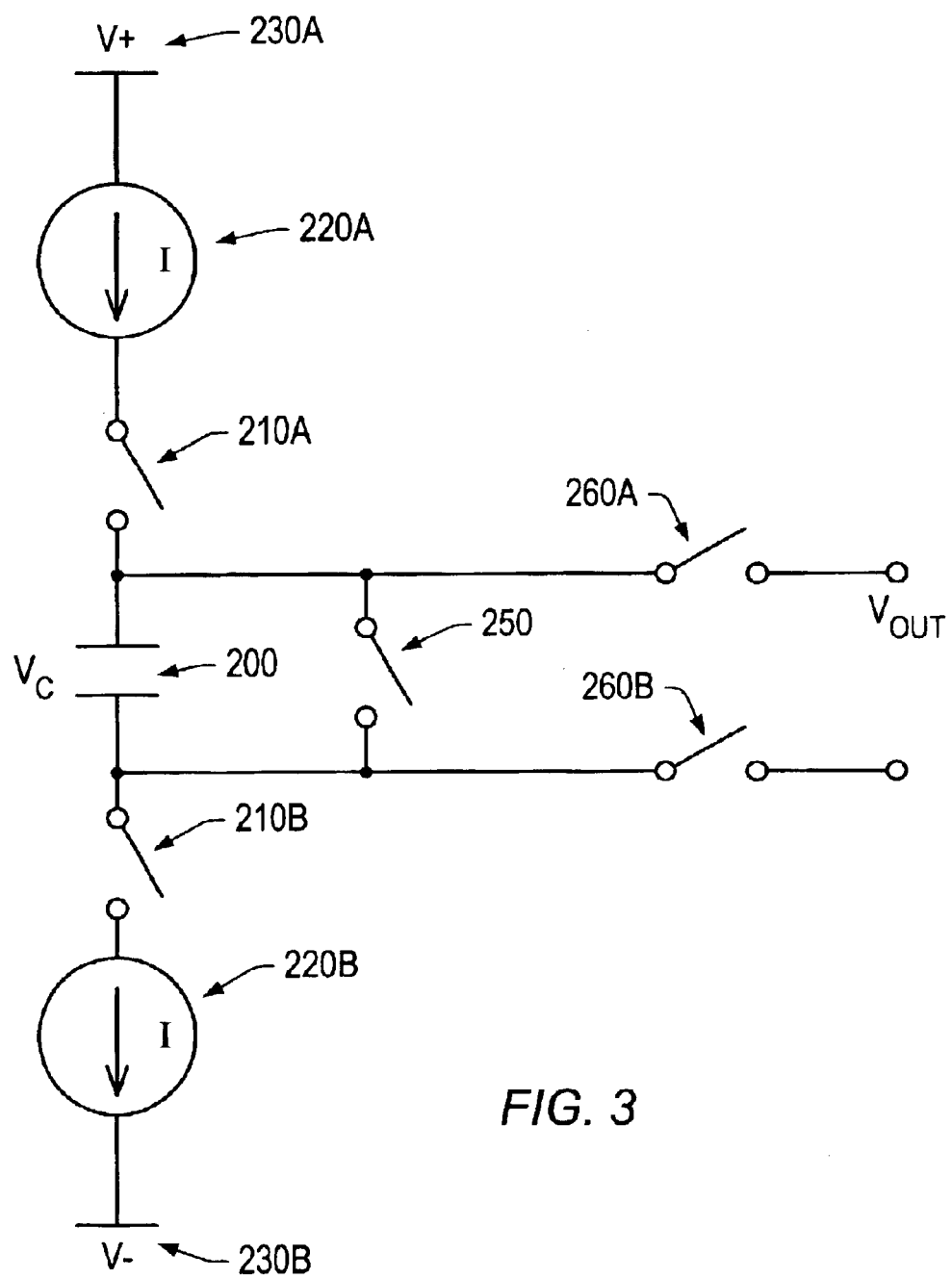
FIG. 3 is a diagram of a periodic phase detector, according to one embodiment.

FIG. 3 illustrates a phase detector capable of detecting the phase relationship between input signals on a periodic basis, according to one embodiment. The constant current supply 220 may include a source 220A tied to supply rail V+ 230A, and a sink 220B tied to supply rail V− 230B. Switch 210 may have two poles and may completely isolate capacitor 200 from both supply rails when open. In some embodiments, this configuration may be implemented as an integrated circuit, for example using CMOS technology. Such an implementation may be capable of operation at lower levels of voltage and power than typical prior art PFDs due in part to an order of magnitude reduction in capacitance of the phase detector as detailed in the phase-locked loop section below.

Output switch 260 may connect both terminals of capacitor 200 to the corresponding phase detector output terminals during the period of time that switch 210 is open, simultaneously isolating the capacitor from the current supplies and voltage rails. In this configuration, the output of the phase detector may be completely differential. The amount of noise (from supply rails and other sources) coupled to the output of the disclosed phase detector may be significantly reduced compared to that of prior art PFDs due to the differential nature of the output configuration.

Discharge switch 250 may connect both terminals of capacitor 200 when closed to rapidly deplete the accumulated charge, thereby reducing the Vc to zero. This discharge may occur while output switch 260 and switch 210 are in their open positions, and at the end of each cycle of the first cyclic waveform input to the phase detector. By resetting the voltage across capacitor 200 to zero at the end of each input cycle, the phase detector of FIG. 3 may be capable of producing and output corresponding to the phase relationship between the input cyclic waveforms during each cycle.

Figure 4:
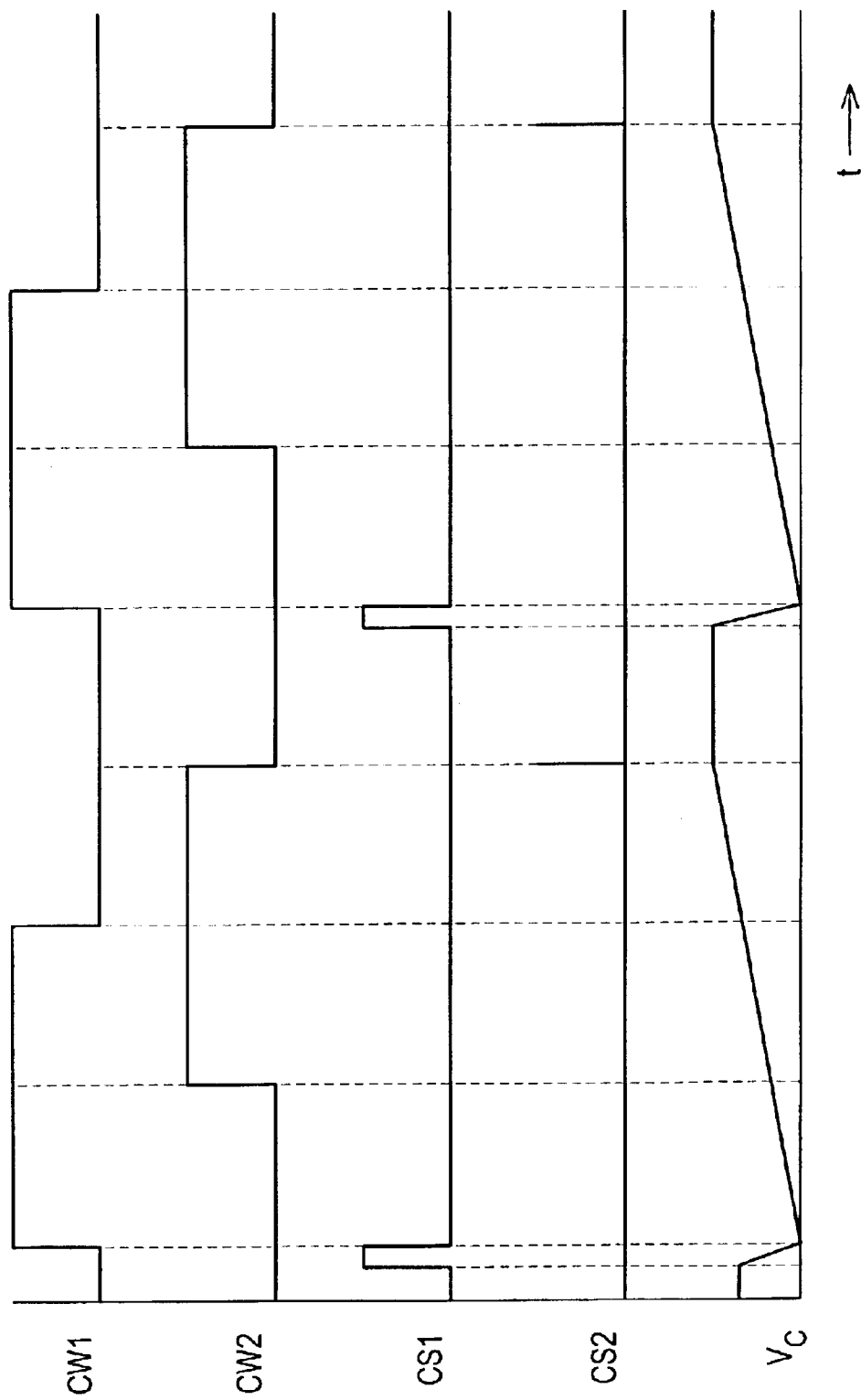
FIG. 4 is a timing diagram for phase detector input, output, and control signals, according to one embodiment.

FIG. 4 is a timing diagram illustrating the relationships between two cyclic waveforms CW1 and CW 2, the control signals CS1 and CS2, and the voltage across capacitor 200, Vc, according to one embodiment. CS1 may be de-asserted coincident with the low-to-high transitions of CW1. The de-assertion of CS1 may close switch 210 and initiate the charging of capacitor 200. Vc may rise at a constant rate during the charging of capacitor 200. CS2 may be asserted coincident with the high-to-low transitions of CW2. The assertion of CS2 may cause switch 210 to open, isolating capacitor 200 from current source 220, and closing output switch 260. Vc may remain constant while output switch 260 is closed. During this period, the magnitude of voltage Vc may represent a phase relationship between cyclic waveforms CW1 and CW2 for this cycle of CW1. After a period of time in which output Vc is available to be sampled, CS1 to may be asserted. The assertion of CS1 may open output switch 260 and close discharge switch 250. The closure of discharge switch 250 may provide a very low impedance path to discharge capacitor 200. As shown in FIG. 4, Vc may decrease rapidly from the steady output value to zero when discharge switch 250 is closed. The charge/discharge cycle may begin again with the subsequent low-to-high transition of CW1 and corresponding de-assertion of CS1.

Phase-Locked Loop

Figure 5:
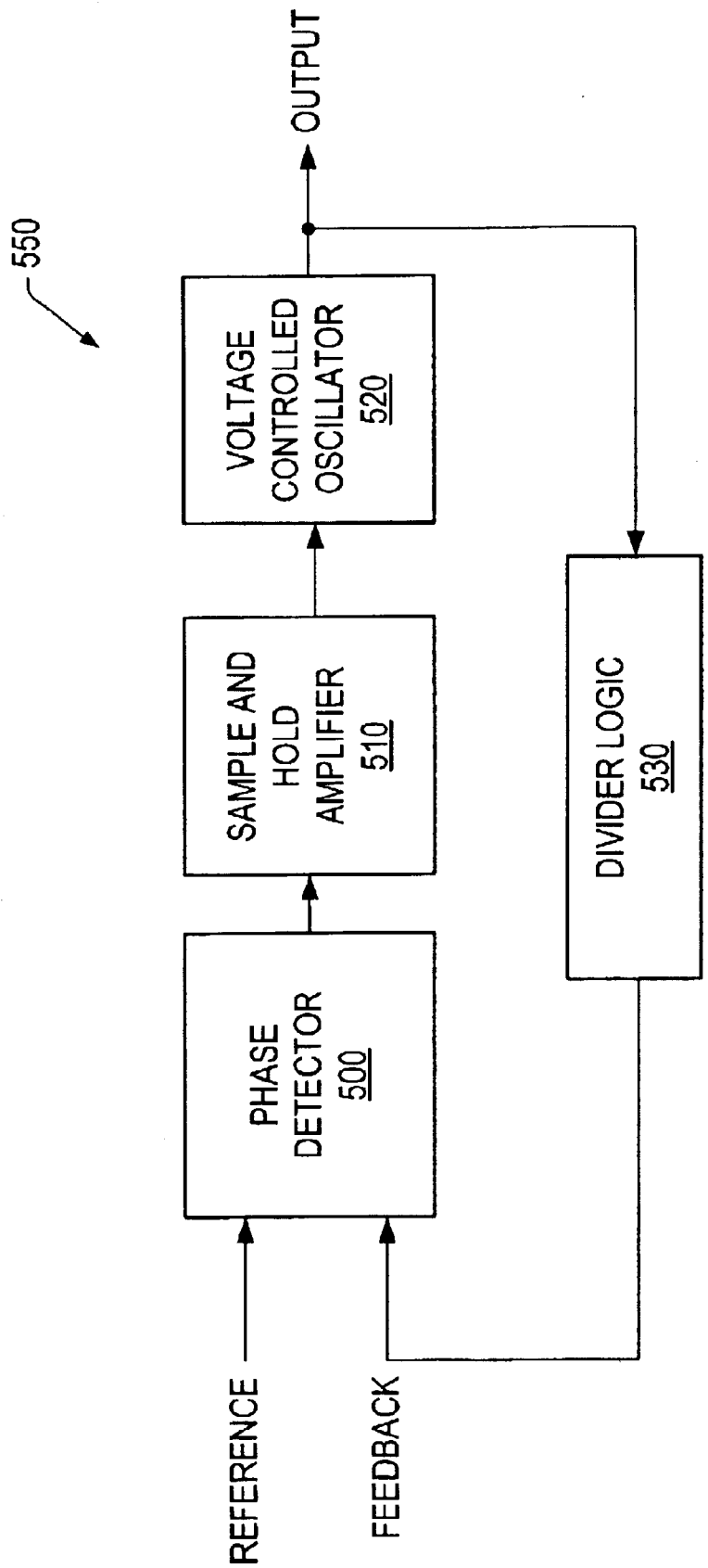
FIG. 5 is a block diagram of a phase-locked loop, according to one embodiment.

FIG. 5 is a block diagram of phase-locked loop (PLL) 550 incorporating an embodiment 500 of the disclosed phase detector. The PLL may receive a cyclic waveform as an input. This signal is shown in FIG. 5 as REFERENCE. In response to receiving the reference input, the PLL may output another cyclic waveform whose frequency is a multiple of the frequency of the reference signal. When the PLL is in the phase-locked condition, the phase relationship between the input and output signals may be constant.

The sample and hold amplifier 510 may sample the output of the phase detector during the portion of the cycle when the output switch of the phase detector is closed. Because Vc is held constant during the sampling period, the sample and hold amplifier in the PLL of FIG. 5 may have a wider aperture than if it were used in a typical, prior art PLL. Once the sample and hold amplifier has sampled the value of Vc from the phase detector, the output of the amplifier will be changed to reflect the new voltage level. Therefore, the output from the sample and hold amplifier that is input to the voltage controlled oscillator (VCO) 520 may be a stepped DC voltage which may reach a constant level when the PLL achieves lock.

In a typical prior art PFD, the output consists of two output pulse streams referred to as UP and DOWN. When the feedback signal (FB) lags the reference signal (REF), the duty cycle of the UP pulse stream will be proportional to the phase difference between REF and FB, while the duty cycle of the DOWN pulse stream will be minimal. Conversely, when FB leads REF, the duty cycle of the UP pulse stream will be minimal and the duty cycle of the DOWN pulse stream will be proportional to the phase difference between FB and REF. When the UP and DOWN pulse streams are integrated and subtracted, the result is an output signal whose amplitude is proportional to the phase difference between the two input signals.

The need to integrate the pulse streams output from the prior art PFD is typically met by applying the streams to a low-pass filter stage. The integration function of the low-pass filter is typically implemented by significant capacitance to ground. In the design of this stage, a tradeoff must be made between reference voltage droop at the integration capacitors and response sensitivity to small changes in PFD output. While large values of integration capacitance may provide a stable reference to the VCO, small changes in the output of the PFD may be masked. This may cause a significant increase in the PLL's lock time. On the other hand, smaller values of integration capacitance may allow the reference to droop, causing oscillations of the VCO output around the desired frequency.

The disclosed phase detector outputs a constant DC reference voltage during a significant portion of each input cycle, which may eliminate the need for a low-pass filter stage when implementing a PLL. Elimination of the low-pass filter stage may improve the lock time and stability of the PLL. In addition, since the phase detector is not required to supply current to drive a low-pass filter, the value of capacitance needed to hold the reference voltage in the disclosed phase detector may be an order of magnitude or more below that required by a typical prior art PFD.

VCO 520 may be capable of outputting cyclic waveforms with frequencies falling within a certain range. The output frequency may be controlled by the input voltage from the sample and hold amplifier. For example, the VCO may have an input voltage range between 0 and 3 volts. The VCO may be configured such that the nominal output frequency is produced when the input voltage is in the center of its range, in this case 1.5V. In this way, the reference frequency input to the phase detector can vary both above and below its expected nominal value, and the input to the VCO can be varied both above and below the 1.5V level in order to maintain the locked condition of the PLL Therefore, when the reference and feedback inputs to the phase detector are phase-locked, the output of the phase detector may be at half of its maximum level.

Referring to the Vc curve of FIG. 4, under phase-locked conditions, the capacitor voltage ramps to half its maximum level during the first half of the input cycle, then is held steady at this level for the second half of the cycle. If the frequency of the reference input increases, the time between the assertion of CS1 and the CS2 may increase and the capacitor voltage may ramp past its midpoint value before being held constant. The increase in Vc may be reflected in the output of the sample and hold amplifier causing the input of the VCO to increase above the half maximum value point. This may cause the output frequency of the VCO and therefore the feedback frequency to increase. When the feedback frequency reaches the new reference frequency, phase-lock may once again be established and the output of the phase detector may return to half its maximum value. Likewise for the case of a reduction in reference frequency, the time between the assertion of CS1 and the CS2 may decrease and the capacitor voltage may ramp short of its midpoint before being held. The input to the VCO may then fall below half maximum value, with a corresponding decrease in output frequency. The feedback frequency may decrease until it is once more equal to the reference frequency.

In some embodiments, the frequency of the output of the VCO may be a multiple of the frequency of the reference input to the phase detector. In some decoders employing a PLL, it may be necessary to sample the incoming signal ten or twenty times per cycle in order to accurately extract the encoded data. By setting the free-running frequency of the VCO in the appropriate range, and including a divider logic stage 530 in the feedback path of the PLL, the output of the VCO may be set to a desired multiple of the frequency of the reference input. The division logic stage may include a string of D flip flops configured as divide-by-two elements. For example, to obtain a PLL output signal with a frequency that is sixteen times the frequency of the reference input signal, four divide-by-two stages may be inserted between the output of the VCO and the feedback input to the phase detector.

Figure 6:
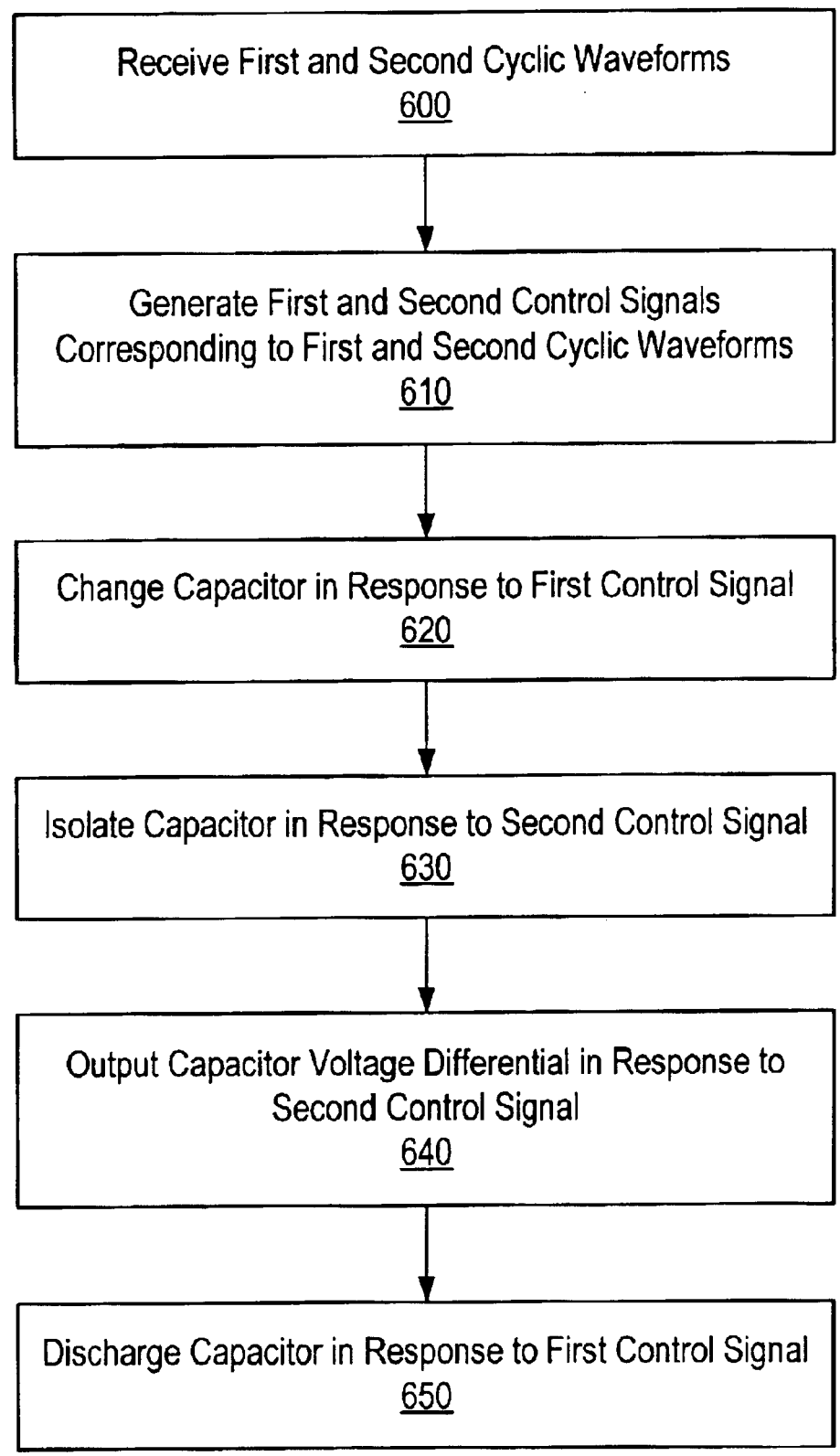
FIG. 6 is a flowchart of one embodiment of a method of operating a phase detector.

FIG. 6 is a flowchart of one embodiment of a method of operating the disclosed phase detector. At 600, two periodic waveforms may be received as inputs to the phase detector. In some embodiments, the cyclic waveforms may be square waves as described previously. As shown in block 610, the control signal generator may derive a first and second control signal from the first and second periodic waveforms. For example, in embodiments where the input waveforms are square waves, the control signal generator may de-assert the first control signal coincident with the rising edge of the first cyclic waveform and assert the second control signal coincident with the falling edge of the second cyclic input.

At 620, a capacitor may be charged in response to the de-assertion of the first control signal. The first control signal may control a switch connected between the capacitor and a current source. The de-assertion of the first control signal may close the switch and allow the current source to charge the capacitor. When the second control signal is asserted, as shown at 630, the switch may be opened, thereby isolating the capacitor from the current source. At 640, the differential voltage across the capacitor may be output to indicate the phase relationship between the first and second input periodic waveforms. In some embodiments, this output may be used in PLL to synchronize the first and second inputs. As shown in block 650, the capacitor may be discharged in preparation for a subsequent phase measurement.

Numerous variations and modifications will become apparent to those skilled in the art once the above disclosure is fully appreciated. It is intended that the following claims be interpreted to embrace all such variations and modifications.

What is claimed is:

1. A method comprising:
    receiving first and second cyclic waveforms;
    generating a first control signal, wherein the de-assertion of the first control signal occurs at a specific point with respect to the first cyclic waveform;
    generating a second control signal, wherein the assertion of the second control signal occurs at a specific point with respect to the second cyclic waveform;
    charging a capacitor from a constant current source in response to de-assertion of a first control signal, wherein the current source comprises a source coupled between a first voltage rail and a first terminal of the capacitor and a sink coupled between a second voltage rail and a second terminal of the capacitor;
    isolating the capacitor from the first and second voltage rails in response to the assertion of a second control signal; and outputting the voltage across the capacitor after the assertion of the second control signal as a differential signal to indicate a phase relationship between the first and second cyclic waveforms.

2. The method of claim 1 further comprising synchronizing the first and second cyclic waveforms utilizing the voltage across the capacitor after the assertion of the second control signal.

3. The method of claim 1, wherein the time during which the first control signal is asserted allows for the discharge of the voltage across the capacitor, which was acquired during the period from the de-assertion of the first control signal until the assertion of the second control signal.

4. The method of claim 1, wherein the first and second cyclic waveforms are square waves.

5. The method of claim 4, wherein the first control signal is de-asserted in response to the rising edge of the first cyclic waveform.

6. The method of claim 4, wherein the second control signal is asserted in response to the falling edge of the second cyclic waveform.

7. The method of claim 1 further comprising discharging the capacitor in response to the assertion of the first control signal.

8. The method of claim 1 wherein the phase relationship between the first and second cyclic waveforms is indicated for each cycle.

9. A device, comprising:

a current source;

a capacitor coupled to an output of the current source; and a switch coupled between the capacitor and the current source;

wherein the switch is operable to receive a first control signal that is de-asserted at a specific point with respect to a first cyclic waveform, and wherein the switch is operable to receive a second control signal that is asserted at a specific point with respect to a second cyclic waveform;

wherein de-assertion of the first control signal closes the switch, thereby supplying current to the capacitor, wherein assertion of the second control signal opens the switch, thereby inhibiting the current to the capacitor;

wherein the voltage across the capacitor after the assertion of the second control signal corresponds to a phase relationship between the first and second cyclic waveforms; and wherein the current source comprises a source coupled between a first voltage rail and a first terminal of the capacitor and a sink coupled between a second voltage rail and a second terminal of the capacitor.

10. The device of claim 9, wherein the switch comprises a first set of elements coupled between the source and the first terminal of the capacitor and a second set of elements coupled between the second terminal of the capacitor and the sink.

11. The device of claim 10, wherein when the switch is open, the capacitor is isolated from both the first and second voltage rails, thus the voltage across the capacitor is a differential signal.

12. The device of claim 9, further comprising a discharge switch coupled to the first and second terminals of the capacitor, wherein when the discharge switch is closed a conductive path is formed between the first and second terminals of the capacitor allowing the capacitor to discharge.

13. The device of claim 12, wherein the discharge switch is closed in response to the assertion of the first control signal.

14. The device of claim 12, wherein the discharge switch is opened in response to the de-assertion of the first control signal.

15. The device of claim 9, further comprising an output switch wherein the output switch comprises a first set of elements coupled between the first terminal of the capacitor and a first differential output node, and a second set of elements coupled between the second terminal of the capacitor and a second differential output node coupled between the first and second terminals of the capacitor and the output nodes, wherein when the output switch is closed conductive paths are formed between the first and second terminals of the capacitor and the corresponding differential output nodes, allowing the capacitor voltage to be output as a differential signal.

16. The device of claim 15, wherein the output switch is closed in response to the assertion of the second control signal.

17. The device of claim 15, wherein the output switch is opened in response to the assertion of the first control signal.

18. The device of claim 9, wherein the first and second cyclic waveforms are square waves.

19. The device of claim 18, wherein the control signal generator de-asserts the first control signal in response to the rising edge of the first cyclic waveform.

20. The device of claim 18, wherein the control signal generator asserts the second control signal in response to the falling edge of the second cyclic waveform.

* * * * *